(12) United States Patent
Aratani et al.

(10) Patent No.: US 9,935,291 B2
(45) Date of Patent: Apr. 3, 2018

(54) ORGANIC LIGHT-EMITTING DEVICE, LIGHT SOURCE DEVICE USING SAME, ORGANIC LIGHT-EMITTING LAYER MATERIAL, COATING LIQUID FOR FORMING ORGANIC LIGHT-EMITTING LAYER, AND METHOD FOR PRODUCING ORGANIC LIGHT-EMITTING DEVICE

(75) Inventors: Sukekazu Aratani, Hitachiota (JP); Hirotaka Sakuma, Hitachinaka (JP); Hiroshi Sasaki, Mito (JP)

(73) Assignee: HITACHI, LTD., Tokyo (JP)

( * ) Notice: Subject to any disclaimer, the term of this patent is extended or adjusted under 35 U.S.C. 154(b) by 1156 days.

(21) Appl. No.: 13/976,499

(22) PCT Filed: Dec. 27, 2011

(86) PCT No.: PCT/JP2011/080200
§ 371 (c)(1),
(2), (4) Date: Jun. 27, 2013

(87) PCT Pub. No.: WO2012/091005
PCT Pub. Date: Jul. 5, 2012

(65) Prior Publication Data
US 2013/0277662 A1 Oct. 24, 2013

(30) Foreign Application Priority Data

Dec. 28, 2010 (JP) ................. 2010-291550

(51) Int. Cl.
*H01L 51/52* (2006.01)
*C09K 11/06* (2006.01)
(Continued)

(52) U.S. Cl.
CPC .......... *H01L 51/5262* (2013.01); *C09K 11/06* (2013.01); *H01L 51/0032* (2013.01);
(Continued)

(58) Field of Classification Search
CPC ........................ H01L 51/5036; H01L 51/5004
See application file for complete search history.

(56) References Cited

U.S. PATENT DOCUMENTS

2002/0094452 A1\* 7/2002 Ueda .............. C09K 11/06
428/690
2005/0037235 A1\* 2/2005 Nishio ............ C09K 11/06
428/690
(Continued)

FOREIGN PATENT DOCUMENTS

JP 09-063770 A 3/1997
JP 2010-202644 A 9/2010
(Continued)

*Primary Examiner* — Alex A Rolland
(74) *Attorney, Agent, or Firm* — Volpe and Koenig, P.C.

(57) ABSTRACT

An organic light-emitting device includes a lower electrode, an upper electrode, and an organic layer disposed between these electrodes. The organic layer is a laminate of a hole injection layer, a hole transport layer, a light-emitting layer, an electron transport layer, and an electron injection layer. The light-emitting layer includes a host and a first dopant. The hole transport layer includes a hole transporting material, and the electron transport layer includes an electron transporting material. The hole transporting material and the electron transporting material have functional groups. The first dopant in the light-emitting layer has a functional group, and is concentrated on the side of the light-emitting layer in contact with the hole transport layer or the electron transport layer.

21 Claims, 4 Drawing Sheets

(51) Int. Cl.
*H01L 51/00* (2006.01)
*H05B 33/14* (2006.01)
*H01L 51/50* (2006.01)

(52) U.S. Cl.
CPC ...... *H01L 51/0035* (2013.01); *H01L 51/0085* (2013.01); *H05B 33/14* (2013.01); *C09K 2211/1029* (2013.01); *C09K 2211/1416* (2013.01); *C09K 2211/185* (2013.01); *H01L 51/5056* (2013.01); *H01L 51/5072* (2013.01); *H01L 2251/5346* (2013.01)

(56) References Cited

U.S. PATENT DOCUMENTS

| | | | |
|---|---|---|---|
| 2006/0127698 A1* | 6/2006 | Tokailin | C07C 211/54 428/690 |
| 2009/0072724 A1* | 3/2009 | Seki | H01L 27/3246 313/504 |

FOREIGN PATENT DOCUMENTS

| | | |
|---|---|---|
| JP | 2010-226145 A | 10/2010 |
| JP | 2010-229121 A | 10/2010 |
| JP | 2010-232269 A | 10/2010 |
| JP | 2011-009517 A | 1/2011 |
| JP | 2011-151096 A | 8/2011 |
| JP | 2011-151097 A | 8/2011 |

* cited by examiner

[FIG. 1]
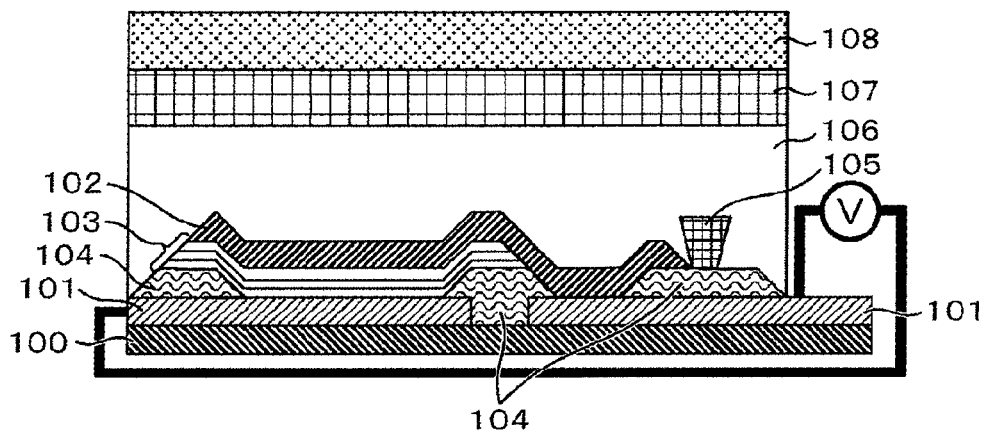
[FIG. 2]
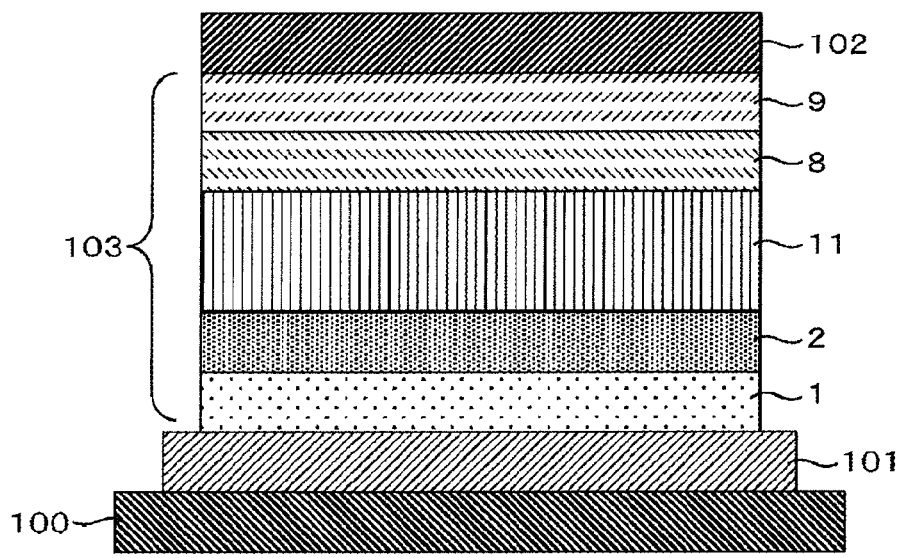

[FIG. 3]
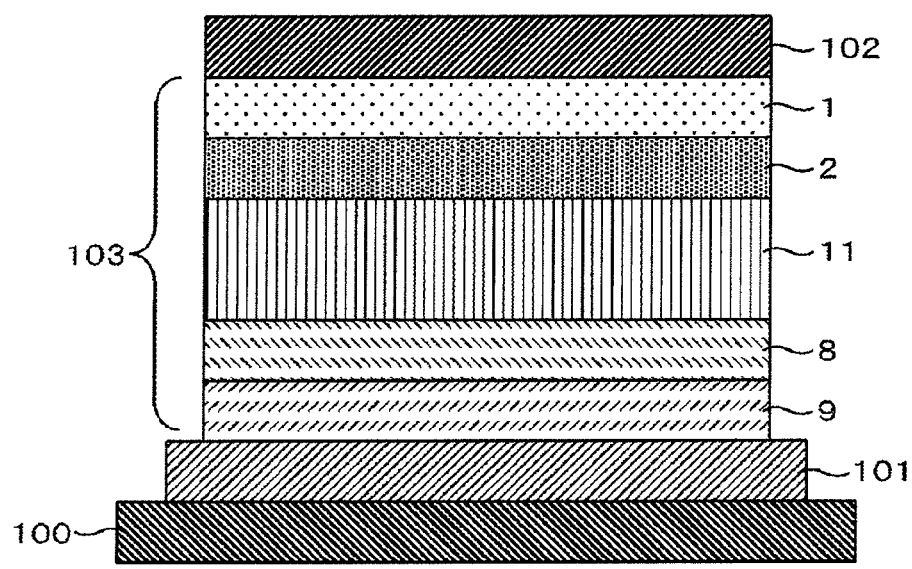

[FIG. 4]
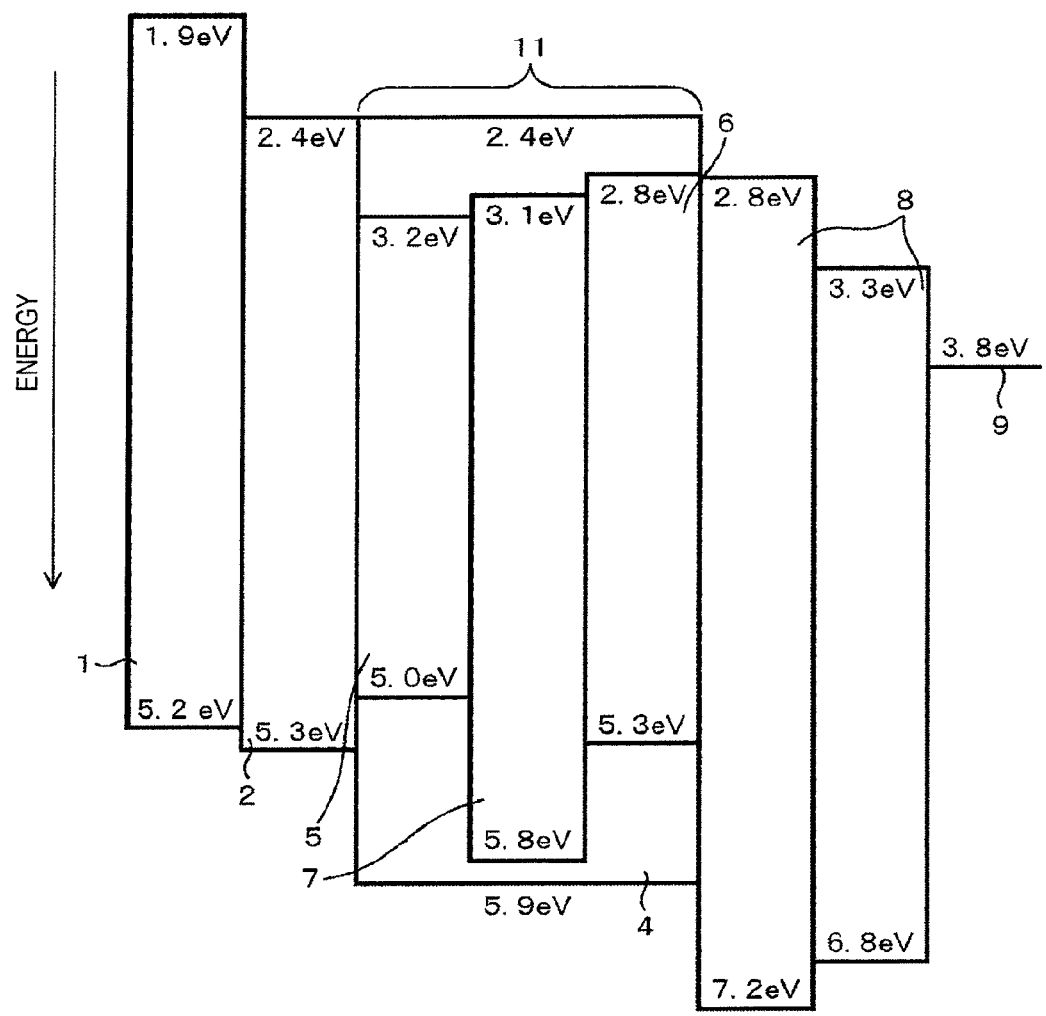

[FIG. 5]
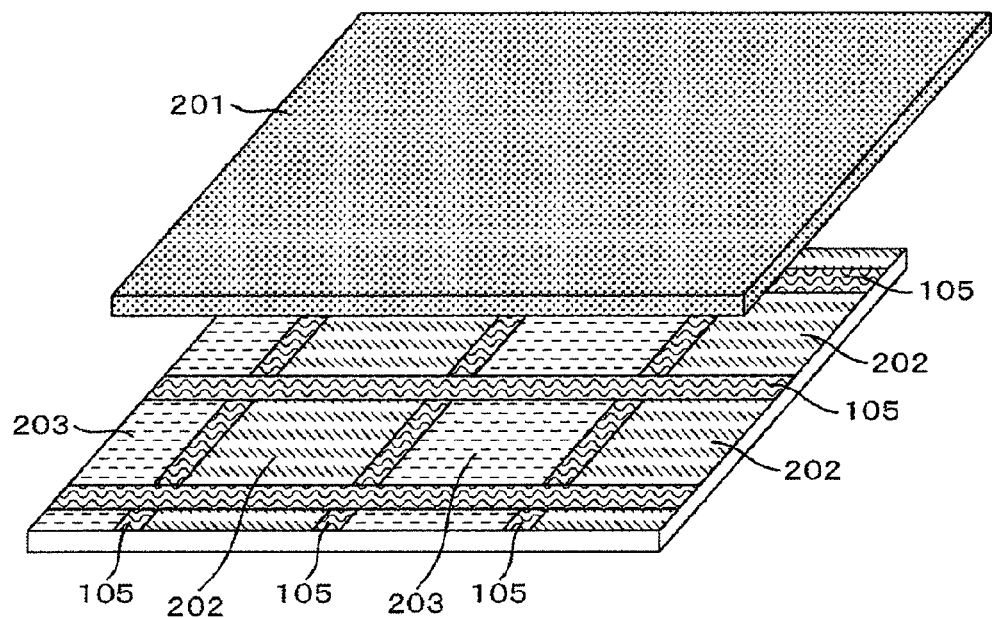

ORGANIC LIGHT-EMITTING DEVICE, LIGHT SOURCE DEVICE USING SAME, ORGANIC LIGHT-EMITTING LAYER MATERIAL, COATING LIQUID FOR FORMING ORGANIC LIGHT-EMITTING LAYER, AND METHOD FOR PRODUCING ORGANIC LIGHT-EMITTING DEVICE

TECHNICAL FIELD

The present invention relates to organic light-emitting layer materials, coating liquids for forming organic light-emitting layers with organic light-emitting layer materials, organic light-emitting devices using the coating liquids for forming organic light-emitting layers, light source devices using the organic light-emitting devices, and methods for producing these.

BACKGROUND ART

PTL 1 discloses a single-layer white emitting organic EL device as an organic white emitting device that has a single-layer light-emitting layer. The single-layer light-emitting layer is inserted between electrodes, and has a composition containing at least a polymer that emits blue color or a color of a wavelength shorter than the wavelength of blue light, and emission center-forming compounds. Two or more of the emission center-forming compounds exist in the polymer by being molecularly dispersed, and the emission center-forming compounds independently emit light.

CITATION LIST

Patent Literature

PTL 1: JP-A-9-63770

SUMMARY OF INVENTION

Technical Problem

Conventional organic light-emitting devices do not have desirable functional groups in the dopant and the charge transport layer, and the dopant concentration cannot be easily controlled.

It is an object of the present invention to provide an organic light-emitting layer material with which the dopant concentration can be easily controlled.

Solution to Problem

An organic light-emitting device of the present invention includes a first electrode, a second electrode, and an organic layer disposed between the first and second electrodes, the organic layer being a laminate of a hole injection layer, a hole transport layer, a light-emitting layer, an electron transport layer, and an electron injection layer disposed in this order, the light-emitting layer including a host and a first dopant, the hole transport layer including a hole transporting material, the electron transport layer including an electron transporting material, the hole transporting material and the electron transporting material each having a functional group, the first dopant in the light-emitting layer having a functional group, and being concentrated on the side of the light-emitting layer in contact with the hole transport layer or the electron transport layer, and the functional group of the first dopant having mutual affinity with the functional group of whichever of the hole transporting material or the electron transporting material positioned on the side where the first dopant is concentrated.

Advantageous Effects of Invention

The present invention can provide an organic light-emitting layer material with which the dopant concentration can be easily controlled, and an organic light-emitting device using such organic light-emitting layer materials.

BRIEF DESCRIPTION OF DRAWINGS

FIG. 1 is a cross sectional view representing an embodiment of a light source device.

FIG. 2 is a cross sectional view representing an embodiment of an organic light-emitting device.

FIG. 3 is a cross sectional view representing an embodiment of an organic light-emitting device.

FIG. 4 is an energy diagram of each material of the organic light-emitting device.

FIG. 5 is a perspective view representing an embodiment of a light source device.

DESCRIPTION OF EMBODIMENTS

An organic light-emitting device according to an embodiment of the present invention is described below.

The organic light-emitting device includes a first electrode, a second electrode, and an organic layer disposed between these electrodes. The organic layer is a laminate of a hole injection layer, a hole transport layer, a light-emitting layer, an electron transport layer, and an electron injection layer disposed in this order. The light-emitting layer includes a host and a first dopant. The hole transport layer and the electron transport layer include charge transporting materials (the hole transport layer includes a hole transporting material, and the electron transport layer includes an electron transporting material). The hole transporting material and the electron transporting material have functional groups. The first dopant in the light-emitting layer has a functional group, and is concentrated on the side of the light-emitting layer in contact with the hole transport layer or the electron transport layer. The functional group of the first dopant has mutual affinity with the functional group of whichever of the hole transporting material or the electron transporting material positioned on the side where the first dopant is concentrated.

As used herein, "mutual affinity" refers to the intermolecular interaction between two or more functional groups, specifically the property to attract each other through attractive interactions.

It is desirable in the organic light-emitting device that the functional group of the first dopant, and the material functional group (the functional group of whichever of the hole transporting material or the electron transporting material positioned on the side where the first dopant is concentrated) corresponds to at least one of the following configurations (i) to (iv).

(i) The functional group of the first dopant, and the material functional group are alkyl groups of 4 or more carbon atoms.

(ii) The functional group of the first dopant, and the material functional group are hydroxyl groups or carboxyl groups.

(iii) The functional group of the first dopant, and the material functional group form a hydrogen bond.

(iv) The functional group of the first dopant is a perfluorophenyl group, and the material functional group is a phenyl group.

It is desirable in the organic light-emitting device that the functional group of the first dopant, and the material functional group correspond to the configuration (iii), and to at least one of the following configurations (v) to (ix).

(v) The functional group of the first dopant is a hydroxyl group, and the material functional group is a carboxyl group.

(vi) The functional group of the first dopant is a carboxyl group, and the material functional group is a hydroxyl group.

(vii) The functional group of the first dopant is an amide group, and the material functional group is an acyl group.

(viii) The functional group of the first dopant is an acyl group, and the material functional group is an amide group.

(ix) The functional group of the first dopant is an amino group, and the material functional group is a hydroxyl group.

It is desirable in the organic light-emitting device that the first dopant concentration in the light-emitting layer peaks on the side of the material relative to the central portion of the light-emitting layer in the thickness direction of the light-emitting layer, and monotonically decreases toward the interface of the light-emitting layer opposite from the material side.

It is desirable in the organic light-emitting device that the light-emitting layer further includes a binder polymer, and that the binder polymer contains any one of polycarbonate, polystyrene, acrylic resin, and polyamide.

It is desirable in the organic light-emitting device that a bank is disposed on the side surface of the organic layer, and that a water-repellent layer is provided on the surface of the bank opposite to the light-emitting layer.

It is desirable in the organic light-emitting device that the light-emitting layer further includes a second dopant, and the first dopant and the second dopant have different emission colors, and that the second dopant has a functional group, and is concentrated at the interface of the light-emitting layer opposite from the material.

It is desirable in the organic light-emitting device that the light-emitting layer further includes a third dopant, and the first dopant and the second dopant have different emission colors, and the third dopant has a different emission color from the emission colors of the first dopant and the second dopant, and that the third dopant has a functional group, and is concentrated on the material side of the light-emitting layer.

It is desirable in the organic light-emitting device that the light-emitting layer further includes a second dopant and a third dopant, and the first dopant and the second dopant have different emission colors, and the third dopant has a different emission color from the emission colors of the first dopant and the second dopant, and that the light-emitting layer emits white light.

It is desirable in the organic light-emitting device that the light-emitting layer is a single layer.

The organic light-emitting device is applicable to light source devices.

The following describes an organic light-emitting layer material, and a coating liquid for forming an organic light-emitting layer used to form the organic light-emitting layer of the organic light-emitting device. An organic light-emitting device producing method is also described.

The organic light-emitting layer material is a mixture containing a host and a first dopant.

The coating liquid for forming an organic light-emitting layer is a mixture containing the organic light-emitting layer material and a solvent.

The organic light-emitting device producing method is a method for producing an organic light-emitting device that includes a first electrode, a second electrode, and an organic layer disposed between these electrodes. The organic layer is a laminate of a hole injection layer, a hole transport layer, a light-emitting layer, an electron transport layer, and an electron injection layer disposed in this order. The light-emitting layer includes a host and a first dopant. The hole transport layer includes a hole transporting material, and the electron transport layer includes an electron transporting material. The hole transporting material and the electron transporting material have functional groups. The first dopant in the light-emitting layer has a functional group, and is concentrated on the side of the light-emitting layer in contact with the hole transport layer or the electron transport layer. The functional group of the first dopant has mutual affinity with the functional group of whichever of the hole transporting material or the electron transporting material positioned on the side where the first dopant is concentrated. The method includes the step of applying a coating liquid for forming an organic light-emitting layer that includes a host, a first dopant, and a solvent.

It is desirable in the producing method that the coating liquid for forming an organic light-emitting layer further includes a second dopant, and the first dopant and the second dopant have different emission colors, and the first dopant has a longer emission peak wavelength than the second dopant, and that the concentration of the second dopant with respect to the solute component of the coating liquid for forming an organic light-emitting layer is 5 mol % or more.

It is desirable in the producing method that the second dopant is a blue dopant or a green dopant.

The present invention is described below in more detail with reference to the accompanying drawings, and elsewhere.

The concrete examples of implementation discussed in the following detailed explanation serve solely to represent the content of the present invention, which should not be narrowly interpreted within the limits of such concrete examples, but rather may be applied in many variations or modifications by a person ordinary skilled in the art within the technical scope of the present invention disclosed herein. Further, in the appended figures referred to in the descriptions of the present invention, functionally same components and/or features may have the same reference numerals, and explanations thereof may be omitted to avoid redundancy.

Vacuum deposition and coating are two major methods used in organic LED production. The advantages of the coating method include easy deposition over large areas, and high material utilization efficiency. The coating method requires reducing the number of layers in the organic LED, and the light-emitting layer needs to be provided as a single layer. As used herein, "organic LED" is a shortened term for "organic light-emitting diode".

In an organic light-emitting device produced by using the conventional coating method, controlling the dopant concentration is difficult because of the very low dopant concentrations, 0.04 mol % for the green dopant, and 0.02 mol % and 0.015 mol % for the two red dopants, needed to suppress energy transfer from the blue dopant. Further, the luminous efficiency is insufficient because of, in part, shortages in energy transfer between the dopants, and insufficient carrier confinement in the emission region.

FIG. 1 is a cross sectional view representing an embodiment of a light source device.

The device shown in the figure is a top-emission organic light-emitting device in which light is extracted from the upper electrode 102 side. Referring to the figure, a lower electrode 101 (first electrode), a first bank 104, a second bank 105, an organic layer 103, an upper electrode 102 (second electrode), a resin layer 106, a sealing substrate 107, and a light extracting layer 108 are disposed in this order on a surface of a substrate 100.

The lower electrode 101 is an anode. The lower electrode 101 may be a cathode. The lower electrode 101 is formed by being patterned, by using, for example, photolithography.

The upper electrode 102 is a cathode when the lower electrode 101 is an anode, and is an anode when the lower electrode 101 is a cathode. When the upper electrode 102 is indium tin oxide (ITO) or indium zinc oxide (IZO) and the ITO or IZO is formed by sputtering, a buffer layer may be provided between the organic layer 103 and upper electrode 102 to alleviate the damage caused by the sputtering. Desirably, metal oxides such as molybdenum oxide and vanadium oxide are used for the buffer layer. The upper electrode 102 is connected to the lower electrode 101 of the adjacent light-emitting unit. In this way, the light-emitting units can be connected to one another in series.

The first bank 104 is forward tapered, covering the end portions of the patterned lower electrode 101 to prevent partial shorting defects in the light-emitting unit. The first bank 104 is formed by developing and exposing the organic layer 103 with a predetermined photomask after the organic layer 103 is formed by coating. The surface of the first bank 104 on the side of the organic layer 103 may be subjected to a water repellent treatment to form a water-repellent layer. For example, the water repellent treatment is performed by the plasma treatment of the surface of the first bank 104 using a fluorine-containing gas to fluorinate the surface of the first bank 104. A photosensitive polyimide is preferably used for the first bank 104. Other materials such as acrylic resin, acrylic resin, novolac resin, phenolic resin, and non-photosensitive material may also be used for the first bank 104.

The second bank 105 is reverse tapered, and is used to prevent conduction between the upper electrodes 102 of the adjacent light-emitting units. The second bank 105 is formed by developing and exposing the organic layer 103 with a predetermined photomask after the organic layer 103 is formed by coating. The surface of the second bank 105 on the side of the organic layer 103 may be subjected to a water repellent treatment to form a water-repellent layer. For example, the water repellent treatment is performed by the plasma treatment of the surface of the second bank 105 using a fluorine-containing gas to fluorinate the surface of the second bank 105. A negative photoresist is preferably used for the second bank 105. Other materials such as acrylic resin, acrylic resin, novolac resin, phenolic resin, and non-photosensitive material may also be used for the second bank 105.

The resin layer 106 is provided to seal the light-emitting unit, and prevent entry of gas and moisture that may cause deterioration in the light-emitting device. Various polymers such as epoxy resin may be used for the resin layer 106. For improved sealing performance, an inorganic passivation film on the upper electrode 102 may be used as the resin layer 106.

The sealing substrate 107 is a glass substrate. Other than glass, a plastic substrate with an appropriate gas barrier film also may be used.

The light extracting layer 108 is used to efficiently extract the emitted light from the organic layer 103. For example, a film having scattering or diffuse reflection characteristics can be used as the light extracting layer 108.

The organic light-emitting device may be provided as a single device, or may be one of multiple devices. The multiple devices may be connected to one another by using, for example, a serial connection method, a parallel connection method, or a serial-parallel connection method. When provided as multiple organic light-emitting devices, the organic light-emitting devices may have the following configurations.

(A) A plurality of single organic light-emitting devices that include a first dopant, a second dopant, and a third dopant.

(B) An organic light-emitting device that includes a first dopant and a second dopant, and an organic light-emitting device that includes a third dopant.

(C) An organic light-emitting device that includes a first dopant, an organic light-emitting device that includes a second dopant, and an organic light-emitting device that includes a third dopant.

Referring to (B), by using red dopant- and green dopant-containing organic light-emitting devices with an organic light-emitting device containing a blue dopant, the influence of energy transfer can be minimized, and the organic light-emitting device containing a blue dopant can efficiently emit light.

Referring to (C), by using a red dopant, a green dopant, and a blue dopant for the first dopant, the second dopant, and the third dopant, respectively, the emitted light colors from the multiple organic light-emitting devices can mix and produce white light.

FIG. 5 is a cross sectional view representing an embodiment of the light source device.

A first organic light-emitting device 202 and a second organic light-emitting device 203 are separated from each other with the second bank 105. A diffusion plate 201 is disposed in the direction where the light from the first organic light-emitting device 202 and the second organic light-emitting device 203 is extracted. Referring to FIG. 5, in the case of the configuration (B) above, the first organic light-emitting device 202 represents the organic light-emitting device that contains a red dopant 5 and a green dopant 6, and the second organic light-emitting device 203 represents the organic light-emitting device that contains a blue dopant 7. Referring to FIG. 5, in the case of the configuration (C) above, the first organic light-emitting device 202 and the second organic light-emitting device 203 each represent any one of the organic light-emitting device that contains the red dopant 5, the organic light-emitting device that contains the green dopant 6, and the organic light-emitting device that contains the blue dopant 7. The organic light-emitting devices may be disposed in stripe patterns as shown in FIG. 5, or in houndstooth patterns.

FIG. 2 is across sectional view representing an organic light-emitting device according to an embodiment of the invention.

The organic light-emitting device shown in the figure includes an upper electrode 102, a lower electrode 101, and an organic layer 103. The upper electrode 102 and the lower electrode 101 correspond to either a first electrode or a second electrode. The substrate 100, the lower electrode 101, the organic layer 103, and the upper electrode 102 are disposed in this order from the bottom of FIG. 2. The organic light-emitting device shown in FIG. 2 is a bottom-emission organic light-emitting device in which light emitted from the light-emitting layer 103 is extracted from the lower electrode 101 side. The lower electrode 101 is a transparent electrode serving as an anode, and the upper electrode 102 is a reflective electrode serving as a cathode.

Note that the organic light-emitting device may have a top-emission device structure in which the upper electrode 102 is the transparent electrode as in FIG. 3, provided that the upper electrode 102 and the lower electrode 101 are cathode and anode, respectively. The substrate 100 and the lower electrode 101, the lower electrode 101 and the organic layer 103, and the organic layer 103 and the upper electrode 102 may be in contact with each other, or layers such as an inorganic buffer layer and an injection layer may be interposed between the layers. Examples of the inorganic buffer layer include vanadium oxide, molybdenum oxide, and tungsten oxide. Examples of the injection layer include an electron injection layer, and a hole injection layer.

The organic layer 103 includes charge transport layers (a hole transport layer 2, and an electron transport layer 8), and a light-emitting layer 11. Referring to FIG. 2, the lower electrode 101 is formed on a surface of the substrate 100, the hole injection layer 1 on the surface of the lower electrode 101, the hole transport layer 2 (charge transport layer) on the surface of the hole injection layer 1, the light-emitting layer 11 on the surface of the hole transport layer 2, the electron transport layer 8 on the surface of the light-emitting layer 11, an electron injection layer 9 on the surface of the electron transport layer 8, and the upper electrode 102 on the surface of the electron injection layer 9.

Alternatively, the layers may be disposed as shown in FIG. 3. Specifically, the lower electrode 101 may be formed on a surface of the substrate 100, the electron injection layer 9 on the surface of the lower electrode 101, the electron transport layer 8 (charge transport layer) on the surface of the electron injection layer 9, the light-emitting layer 11 on the surface of the charge transport layer, the hole transport layer 2 on the surface of the light-emitting layer 11, the hole injection layer 1 on the surface of the hole transport layer 2, and the upper electrode 102 on the surface of the hole injection layer 1. In any case, the light-emitting layer 11 is in contact with the charge transport layer. With the exception of the relationship between the light-emitting layer 11 and the charge transport layer, the layers forming the organic layer 103 may be in contact with one another, or layers such as an inorganic buffer layer and an injection layer may be interposed between the layers.

The electron transport layer 8 and the hole transport layer 2 are among the possible examples of the charge transport layers. The charge transport layer contains charge transport material (hereinafter, also referred to as "charge transporting material"). When the charge transport layer is the hole transport layer 2, the charge transport layer can be selected from a wide range of materials.

The light-emitting layer 11 includes a host 4 and a first dopant. The light-emitting layer 11 is a layer where the electrons or holes injected from the upper electrode 102, the lower electrode 101, the electron transport layer 8, or the hole transport layer 2 recombine and emit light. Emission may occur inside the light-emitting layer 11, or at the interface between the light-emitting layer 11 and the layer adjacent to the light-emitting layer 11. The color of the emission from the light-emitting layer 11 is not particularly limited, and is preferably white. The light-emitting layer 11 may be a single layer, or may be a laminate of a plurality of light-emitting layers 11 that have different emission colors.

The first dopant and the charge transport material are given appropriate functional groups, and the first dopant in the light-emitting layer 11 is localized on a surface on the side of the charge transport layer through interaction with the charge transport material. For example, when the functional groups given to the first dopant and the charge transport material are alkyl groups of 4 or more carbon atoms, the first dopant is localized in the vicinity of the charge transport layer through interactions between the alkyl chains. In this case, by the presence of the functional groups in the first dopant and the charge transport material, the first dopant in the light-emitting layer 11 is drawn toward the interface of the light-emitting layer 11 on the side of the charge transport layer. In this way, a pseudo laminate can be formed in a single application. In the manner described above, the coating method enables the first dopant to be drawn toward the charge transport layer side to be coated.

Here, the first dopant in the light-emitting layer 11 forms a concentration distribution, and the first dopant concentration in the light-emitting layer peaks on the side of the charge transport layer relative to the central portion of the light-emitting layer 11 in the thickness direction of the light-emitting layer 11. The first dopant concentration monotonically decreases from its peak in the thickness direction of the light-emitting layer 11 toward the surface on the side of the light-emitting layer 11 where the charge transport layer is absent at the time of forming the light-emitting layer 11. When using the interaction between the first dopant and the charge transport material, hydroxy groups or carboxyl groups may be used as the functional groups of the first dopant and the charge transport material.

The interaction between the first dopant and the charge transport material can be strengthened, and the first dopant can be localized in the vicinity of the charge transport layer when substituents capable of forming hydrogen bonds are provided for the functional groups of the first dopant and the charge transport material. Possible examples of the substituents capable of forming hydrogen bonds include, but are not limited to, the configurations below.

The substituents capable of forming hydrogen bonds include at least one of the following configurations, or may include two or more configurations. Desirably, only one of the following configurations is selected as the substituents capable of forming hydrogen bonds, because it can suppress formation of hydrogen bonds between the first dopants.

(D) The functional group of the first dopant is a hydroxyl group, and the functional group of the charge transport material is a carboxyl group.

(E) The functional group of the first dopant is a carboxyl group, and the functional group of the charge transport material is a hydroxyl group.

(F) The functional group of the first dopant is an amide group, and the functional group of the charge transport material is an acyl group.

(G) The functional group of the first dopant is an acyl group, and the functional group of the charge transport material is an amide group.

(H) The functional group of the first dopant is an amino group, and the functional group of the charge transport material is a hydroxyl group.

Examples of the acyl group include alkanoyl groups (such as carboxyl groups, and acetyl groups), benzoyl groups, sulfonyl groups, and phosphonoyl groups. The functional groups may be given either directly to the backbone of the dopant or the charge transport material, or via amide bonds, ester bonds, and the like.

A strong intermolecular attraction comparable to that of hydrogen bonding can be obtained when the functional group of the first dopant is a perfluorophenyl group, and the functional group of the charge transport material is a phenyl group.

In sum, the following configurations are possible as the functional group of the first dopant, and the functional group of the charge transport material. The functional groups necessarily have at least one of the following configurations, and may have two or more configurations.

(I) The functional group of the first dopant, and the functional group of the charge transport material are alkyl groups of 4 or more carbon atoms.

(J) The functional group of the first dopant, and the functional group of the charge transport material form a hydrogen bond.

(K) The functional group of the first dopant is a perfluorophenyl group, and the functional group of the charge transport material is a phenyl group.

The functional groups may be given to all of or some of the first dopants contained in the light-emitting layer 11. Similarly, the functional groups may be given to all of or some of the charge transport materials contained in the charge transport layer.

The host 4 may be given functional groups. The functional groups of the host 4 function in the same way as the functional groups of the first dopant. When the host 4 is given host 4 functional groups, the host 4 functional groups may be given to all of or some of the hosts 4 contained in the light-emitting layer 11. For more localization of the first dopant, it is desirable that the host 4 is not given host 4 functional groups.

When the first dopant and the second dopant contained in the light-emitting layer 11 are of different emission colors, it is desirable that the first dopant and the second dopant contain a first-dopant functional group and a second-dopant functional group, respectively. With the second-dopant functional group added to the second dopant, the second dopant in the light-emitting layer 11 is concentrated and localized on a surface on the side where the charge transport layer is absent at the time of forming the light-emitting layer 11. That is, the second dopant forms a concentration gradient in the light-emitting layer 11.

With the second-dopant functional group added to the second dopant, the second dopant concentration in the light-emitting layer peaks on the side of the light-emitting layer 11 where the charge transport layer is absent at the time of forming the light-emitting layer 11, relative to the central portion of the light-emitting layer 11 in the thickness direction of the light-emitting layer 11. The second dopant concentration monotonically decreases from its peak toward the charge transport layer side in the thickness direction of the light-emitting layer 11.

Examples of the second-dopant functional group include fluoroalkyl groups, perfluoroalkyl groups, alkyl groups (of 10 or more carbon atoms), perfluoropolyether groups, and siloxy groups (—Si—O—Si—). Considering surface energy, fluoroalkyl groups and perfluoropolyether groups are desirable, and perfluoroalkyl groups are further desirable. The second dopant necessarily contains any one of these functional groups, and may contain more than one functional groups. These groups may be introduced either directly to the backbone, or via amide bonds, ester bonds, and the like.

When the second dopant is given fluorine-containing substituents, increasing the number of fluorine atoms makes the second dopant in the light-emitting layer 11 more concentrated on a surface on the side where the charge transport layer is absent at the time of forming the light-emitting layer 11. Specifically, it is desirable that at least seven fluorine atoms are contained in the substituents. Instead of giving the charge transport material functional group to the charge transport material, the charge transport layer may contain a surfactant, and the charge transport material functional group may be given to the surfactant. Examples of the surfactant include siloxane surfactants, fluorosurfactants, and non-ionic surfactants. Containing a surfactant in the charge transport layer can improve the flatness of the light-emitting layer, and can lower the reactive current and thus improve the power efficiency. When the charge transport layer contains a surfactant with the charge transport material functional group, the charge transport material functional group may be given to the charge transport material. In this case, the charge transport material functional group given to the surfactant is not necessarily required to be the same charge transport material functional group given to the charge transport material. When the charge transport layer contains a surfactant, the charge transport material functional group may be given to all of or some of the surfactants contained in the charge transport layer.

<Host>

It is preferable to use carbazole derivatives, fluorene derivatives, arylsilane derivatives, and the like as the host 4. Binder polymers such as polycarbonate, polystyrene, acrylic resin, and polyamide also may be used. Using the binder polymer makes it easier to control the viscosity of the host 4 and form the film by printing. Further, the binder polymer increases the film strength of the light-emitting layer 11, and improves the handling of the light-emitting layer 11. The binder polymers may be used either alone, or in a combination of two or more.

For efficient emission, it is preferable that the excitation energy of the host be sufficiently larger than the excitation energy of the blue dopant 7 used as the dopant. Note that excitation energy is measured by using an emission spectrum.

<Dopant>

Fluorescent compounds and phosphorescent compounds may be used as the dopants. Examples of the dopants include the red dopant 5, the green dopant 6, and the blue dopant 7. The light-emitting layer 11 necessarily contains at least one dopant of a single emission color, and may contain a plurality of dopants of different emission colors.

As used herein, "different emission colors" means different maximum intensity wavelengths in the PL spectra of the dopants. With a plurality of dopants of different emission colors contained in the light-emitting layer 11, the light-emitting layer 11 can emit white light. For example, the light-emitting layer 11 emits white light with the red dopant 5, the green dopant 6, and the blue dopant 7 contained therein. When more than one dopants are contained, the first-dopant functional group may be given to all of the dopants, or to at least one of the dopants. When the light-emitting layer 11 contains three or more dopants, the first-dopant functional group may be given to at least two of the dopants to balance charge. For example, when the light-emitting layer 11 contains first to third dopants of different emission colors, it is desirable to give the first-dopant functional group to the first dopant, a functional group of the same functionality as the first-dopant functional group to the third dopant, and the second-dopant functional group to the second dopant. The functional groups of the first dopant and the third dopant are not necessarily required to be the same.

The blue dopant 7 has the maximum intensity in the 400 nm to 500 nm wavelength range of the PL spectrum at room temperature. Ir complexes are used for the blue dopant 7. Various metal complexes of metals such as Pd, Pt, and Al, and organic materials such as styrylamine materials also may be used. Desirably, the blue dopant 7 has a weight-average molecular weight of from 250 to 3,000.

Here, "from 250 to 3,000" has the same meaning as "250 or more and 3,000 or less", and is the same as "250 to 3,000". The same applies to all the other numerical ranges recited in this specification.

The green dopant 6 has the maximum intensity in the 500 nm to 590 nm wavelength range of the PL spectrum at room temperature. Ir complexes are used for the green dopant 6. Various metal complexes of metals such as Pd, Pt, Al, and Zn, and organic materials such as coumalin dye, and quinacridone also may be used. Desirably, the green dopant 6 has a weight-average molecular weight of from 250 to 3,000.

The red dopant 5 has the maximum intensity in the 590 nm to 780 nm wavelength range of the PL spectrum at room temperature. Ir complexes are used for the red dopant 5. Various metal complexes of metals such as Pd, Pt, Al, and Zn, and organic materials such as DCM([2-[(E)-4-(dimethylamino)styryl]-6-methyl-4H-pyran-4-ylidene]malononitrile) also may be used. Desirably, the red dopant 5 has a weight-average molecular weight of from 250 to 3,000.

<Coating Liquid>

The coating liquid is a solution of the host 4 and the dopant dissolved in a suitable solvent. The solvent is not limited, as long as it can dissolve the materials used. Examples include aromatic hydrocarbon solvents such as toluene, ether solvents such as tetrahydrofuran, alcohols, and fluorine solvents. Mixed solvents of different solvents also may be used to adjust the solubility and the drying speed of the materials.

When the light-emitting layer 11 contains a plurality of dopants of different emission colors, the concentration of the dopant having the shortest emission peak wavelength is desirably 5 mol % or more with respect to the solid component of the coating liquid. For example, when the light-emitting layer 11 contains the first and second dopants of different emission colors, and the first dopant has a longer emission peak wavelength than the second dopant, the second dopant concentration is desirably 5 mol % or more with respect to the solid component of the coating liquid. In this way, the energy transfer of the second dopant can be suppressed, and the second dopant can efficiently emit light. The dopant concentration with respect to the solid component of the coating liquid is measured by high-performance liquid chromatography (HPLC).

Further, when the coating liquid contains the blue dopant 7 or the green dopant 6, the concentration of the blue dopant 7 or the green dopant 6 with respect to the solid component of the coating liquid is desirably 5 mol % or more. When the concentration of the blue dopant 7 is 5 mol % or more, charge mobility increases and the charge balance improves. Charge transport improves when the concentration of the green dopant 6 is 5 mol % or more, provided that the light-emitting layer 11 does not contain the blue dopant 7 in addition to the green dopant 6.

Examples of the coating method used to deposit the light-emitting layer 11 include spin coating, casting, dip coating, spray coating, screen printing, inkjet printing, reverse printing, slit coating, and capillary coating.

<Hole Injection Layer>

The hole injection layer 1 is used to improve luminous efficiency and lifetime. The hole injection layer 1 is also used to alleviate anode irregularities, though this is not particularly required. The hole injection layer 1 may be provided as a single layer or multiple layers. Conductive polymers such as PEDOT (poly(3, 4-ethylenedioxythiophene))-PSS(polystyrenesulfonate) are preferably used as the hole injection layer 1. Other polymer materials, such as polypyrrole materials and triphenylamine materials also may be used. Phthalocyanine compounds and starburstamine compounds, commonly used in combination with low-molecular materials (a weight-average molecular weight of 10,000 or less), also may be used.

<Hole Transport Layer 2>

The hole transport layer 2 is used for the transport of holes to the light-emitting layer 11 after the holes are injected from the anode. Materials such as fluorene, carbazole, and arylamine are used for the hole transport layer 2, either alone or as a copolymer. Materials having thiophenes or pyrroles in the skeleton also may be used as copolymers. It is also possible to use polymers having, for example, a fluorene, a carbazole, an arylamine, a thiophene, or a pyrrole skeleton on the side chains. The material of the hole transport layer 2 is not limited to polymer, and materials such as starburstamine compounds, arylamine compounds, stilbene derivatives, hydrazone derivatives, and thiophene derivatives also may be used. Polymers containing these materials also may be used. These materials are non-limiting examples, and may be used in a combination of two or more.

<Electron Transport Layer 8>

The electron transport layer 8 is a layer that supplies electrons to the light-emitting layer 11. In the broad sense, the electron injection layer 9 and the hole blocking layer also are classified into the electron transport layer 8. The electron transport layer 8 may be provided as a single layer or multiple layers. Examples of the material of the electron transport layer 8 include bis(2-methyl-8-quinolinolato)-4-(phenylphenolato)aluminum (hereinafter, "BAlq"), tris(8-quinolinolato)aluminum (hereinafter, "Alq3"), tris(2,4,6-trimethyl-3-(pyridin-3-yl)phenyl)borane (hereinafer, "3TPYMB"), 1,4-bis(triphenylsilyl)benzene (hereinafter, "UGH2"), oxadiazole derivatives, triazole derivatives, fullerene derivatives, phenanthroline derivatives, and quinoline derivatives.

<Electron Injection Layer>

The electron injection layer 9 improves the efficiency of the electron injection from the cathode to the electron transport layer 8. Specifically, it is desirable to use lithium fluoride, magnesium fluoride, calcium fluoride, strontium fluoride, barium fluoride, magnesium oxide, or aluminum oxide. These materials are non-limiting examples, and may be used in a combination of two or more. Further, n-type charge transport materials doped with metal or organic material also may be used.

<Substrate>

The substrate 100 may be, for example, a glass substrate, a metal substrate, or a plastic substrate with inorganic material such as $SiO_2$, $SiN_x$, and $Al_2O_3$. The plastic substrate and the metal substrate may be suitably provided with a protective film against permeability drop. Examples of the metal substrate material include alloys such as stainless steel, and 42 alloy. Examples of the plastic substrate material include polyethylene terephthalate, polyethylene naphthalate, polymethylmethacrylate, polysulfone, polycarbonate, and polyimide.

<Anode>

Materials with high work function can be used as the anode material. Specific examples include conductive oxides such as ITO and IZO, and metals having large work function (such as thin silver). A laminate of a transparent electrode (such as ITO and IZO), and a reflective electrode (such as silver) also may be used. It is also possible to use Mo, Cr, or a transparent electrode in combination with a light diffusing layer. Typically, the electrode may be patterned on a substrate such as glass by using photolithography or the like.

<Cathode>

The cathode material is an electrode for injecting electrons to the light-emitting layer 3. Specifically, for example, a laminate of LiF and Al, and a MgAg alloy are preferably used. A laminate of a transparent electrode (such as ITO and IZO) and an electron injecting electrode (such as MgAg and Li) also may be used. A thin film of MgAg or Ag may be used alone. These materials are non-limiting examples, and, for example, Cs compounds, Ba compounds, and Ca compounds may be used instead of LiF.

The contents of the present invention are described below in greater detail using specific examples.

Example 1

The cross sectional view of the organic light-emitting device of Example 1 is as shown in FIG. 2. A glass substrate was used as the substrate 100, and a laminated film of Ag and ITO as the lower electrode 101. As the hole injection layer 1, PEDOT (poly(3,4-ethylenedioxythiophene))-PSS (polystyrenesulfonate) was used. A polymer material represented by the following chemical formula [Chem. 1] was used as the hole transport layer 2.

An Ir complex represented by the following chemical formula [Chem. 3] was used as the red dopant. 5.

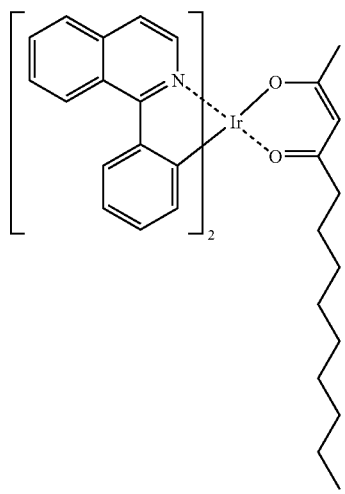

(Chem. 3)

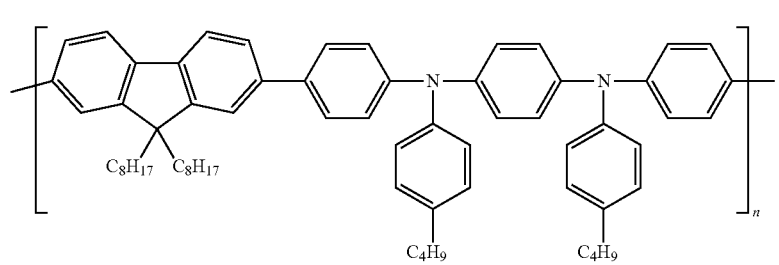

(Chem. 1)

A carbazole derivative represented by the following chemical formula [Chem. 2] was used as the host 4 of the light-emitting layer 11.

An Ir complex represented by the following chemical formula [Chem. 4] was used as the blue dopant 7.

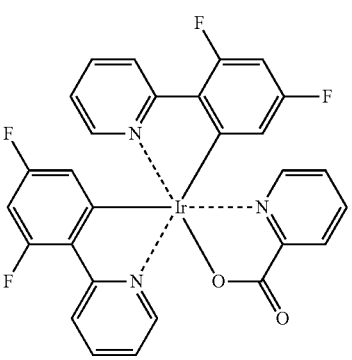

(Chem. 4)

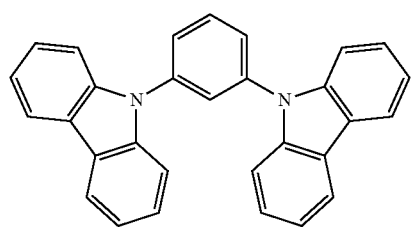

(Chem. 2)

An Ir complex represented by the following chemical formula [Chem. 5] was used as the green dopant 6.

(Chem. 5)

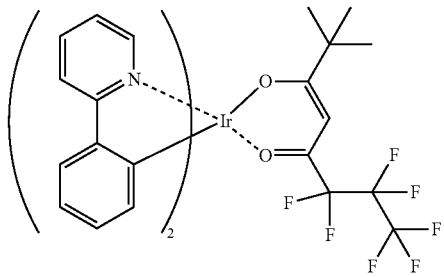

The light-emitting layer coating liquid was prepared by dissolving the host 4, the red dopant 5, the green dopant 6, and the blue dopant 7 in a suitable solvent. In this Example, the solid component molar concentrations of the host 4, the red dopant 5, the green dopant 6, and the blue dopant were 0.5 mol % for the red dopant 5, 1.0 mol % for the green dopant 6, and 5.8 mol % for the blue dopant 7. Toluene was used as the solvent.

A laminate structure of the substances represented by the following chemical formulae [Chem. 6] and [Chem. 7] was used as the electron transport layer 8.

(Chem. 6)

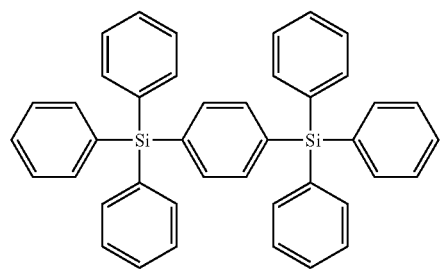

(Chem. 7)

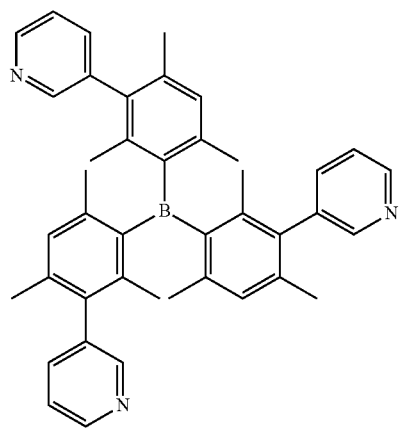

MgAg was used as the electron injection layer 9, and IZO as the upper electrode 102.

White emission composed of the three colors of red, green, and blue was obtained upon applying positive potential and negative potential to the lower electrode 101 and the upper electrode 102, respectively, of this Example.

The red dopant 5 and the blue dopant 7 spontaneously localized on the hole transport layer 2 side and the electron transport layer 8 side, respectively. The band diagram is as shown in FIG. 4. FIG. 4 is an energy diagram of each material in the organic light-emitting device. In this case, electrons were injected to the light-emitting layer 11 from the electron transport layer 8, and then to the green dopant 6. After being transported via the blue dopant 7, the electrons are injected to the red dopant 5 in the vicinity of the interface of the hole transport layer 2. Because the red dopant 5 is much less abundant than the blue dopant 7, electron transfer from the blue dopant 7 to the red dopant 5 is restricted, and the electrons accumulate at the interface. On the other hand, the holes are injected to the host from the hole transport layer 2, and move into the blue dopant 7, upon which recombination occurs and light is emitted. Here, energy transfer to the red dopant 5 occurs, and a red color is also emitted. Blue emission occurs efficiently, because an energy barrier against electrons exists between the hole transport layer 2 and the blue dopant 7. The holes are also injected to the green dopant 6 from the host, and a green color is emitted. The light source device using the organic light-emitting device of this Example has a cross section as shown in FIG. 1.

The organic light-emitting device was mated with the sealing substrate 107, and sealed with an epoxy resin used as the resin layer 106. The light extracting layer 108 of a scattering characteristic was provided on the opposite side from the sealing substrate. The resulting light source device emitted white light upon applying positive potential and negative potential to the lower electrode 101 and the upper electrode 102, respectively.

In a light-emitting device produced in the same manner as in Example 1 except for using the red dopant 5 of the following chemical formula [Chem. 8], the blue and green emission was weak, and only strong red emission was obtained. This is believed to be due to the proximity of the red dopant 5 to the blue dopant 7 and the green dopant 6, causing energy transfer to the red dopant 5.

(Chem. 8)

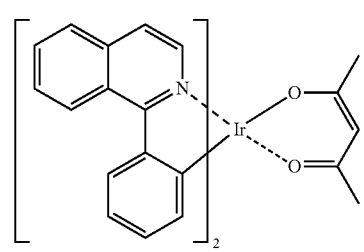

Example 2

An organic light-emitting device was produced in the same manner as in Example 1, except for using the hole transport layer 2 of the following chemical formula [Chem. 9], and the red dopant 5 of the following chemical formula [Chem. 10]. The device emitted white light composed of the three colors of red, green, and blue.

(Chem. 9)
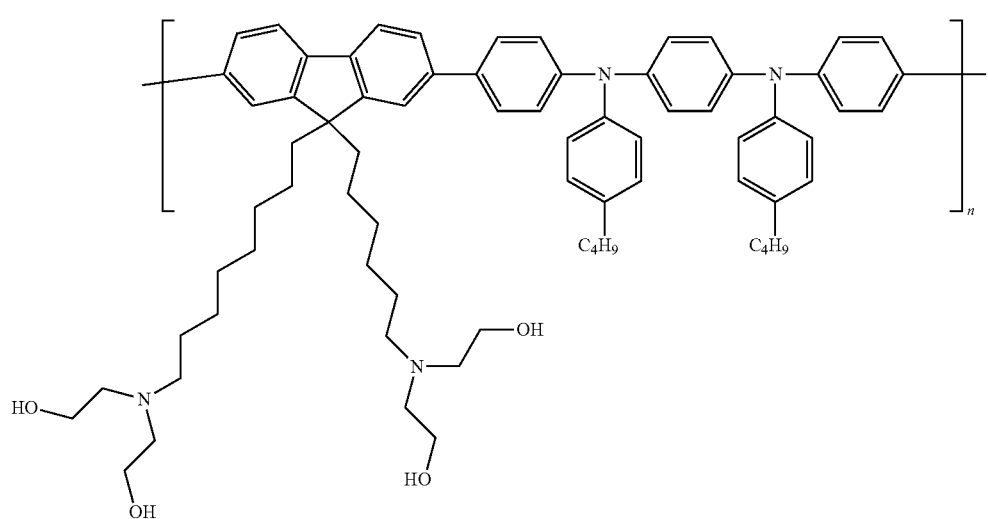
(Chem. 10)
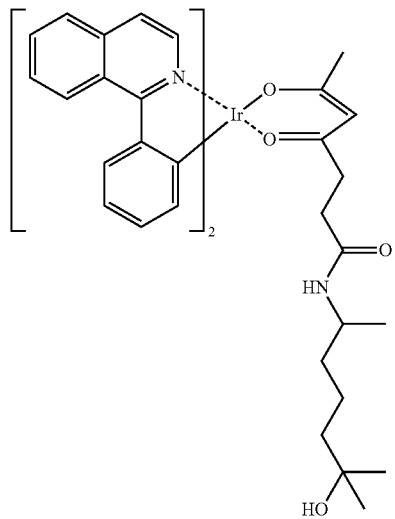

Example 3
An organic light-emitting device was produced in the same manner as in Example 1, except for using the hole transport layer 2 of the following chemical formula [Chem. 11], and the red dopant 5 of the following chemical formula [Chem. 12]. The device emitted white light composed of the three colors of red, green, and blue.
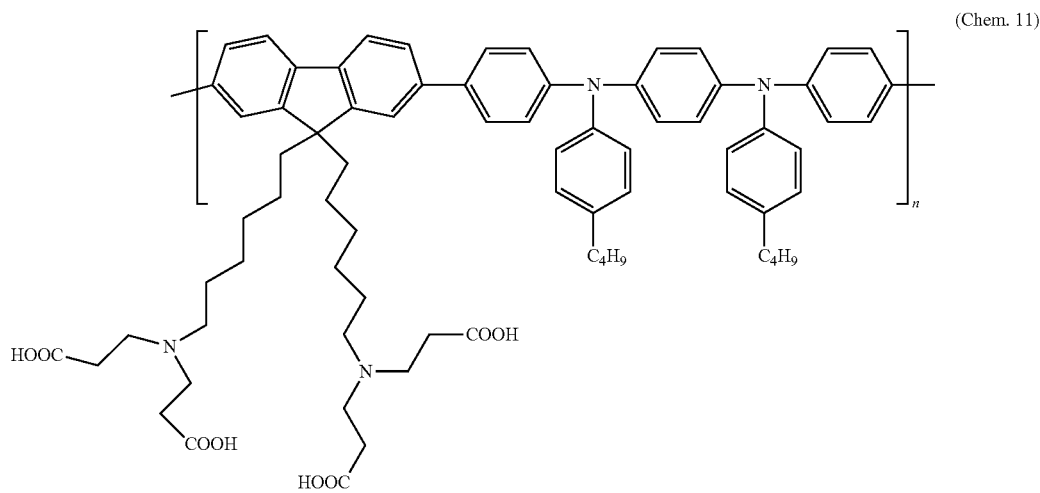
(Chem. 11)
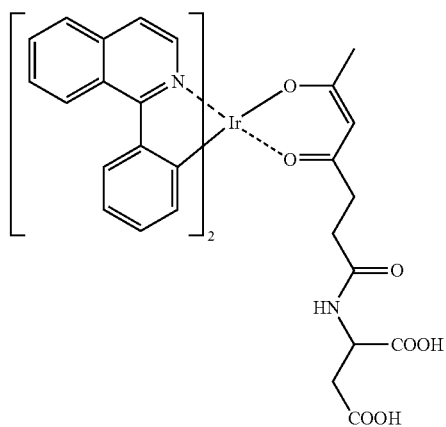
(Chem. 12)

Example 4

An organic light-emitting device was produced in the same manner as in Example 1, except for using the hole transport layer 2 of the chemical formula [Chem. 11], and the red dopant 5 of the chemical formula [Chem. 10]. The device emitted white light composed of the three colors of red, green, and blue.

Example 5

An organic light-emitting device was produced in the same manner as in Example 1, except for using the hole transport layer 2 of the chemical formula [Chem. 11], and the red dopant 5 of the following chemical formula [Chem. 13]. The device emitted white light composed of the three colors of red, green, and blue.

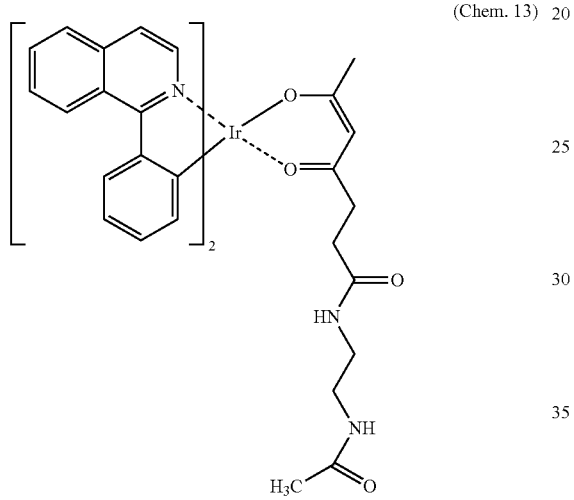

(Chem. 13)

Example 6

An organic light-emitting device was produced in the same manner as in Example 1, except for using the hole transport layer 2 of the chemical formula [Chem. 9], and the red dopant 5 of the following chemical formula [Chem. 14]. The device emitted white light composed of the three colors of red, green, and blue.

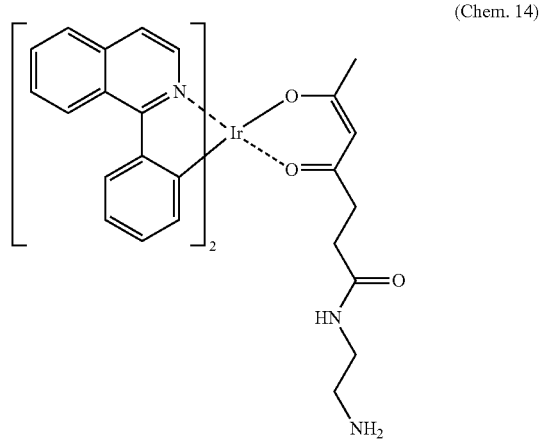

(Chem. 14)

Example 7

An organic light-emitting device was produced in the same manner as in Example 1, except for using the hole transport layer 2 of the following chemical formula [Chem. 15], and the red dopant 5 of the following chemical formula [Chem. 16]. The device emitted white light composed of the three colors of red, green, and blue.

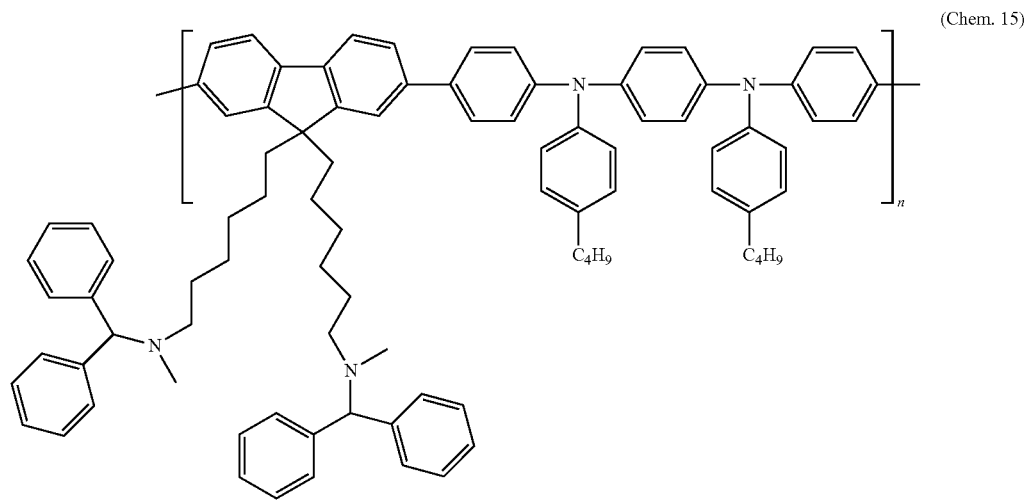

(Chem. 15)

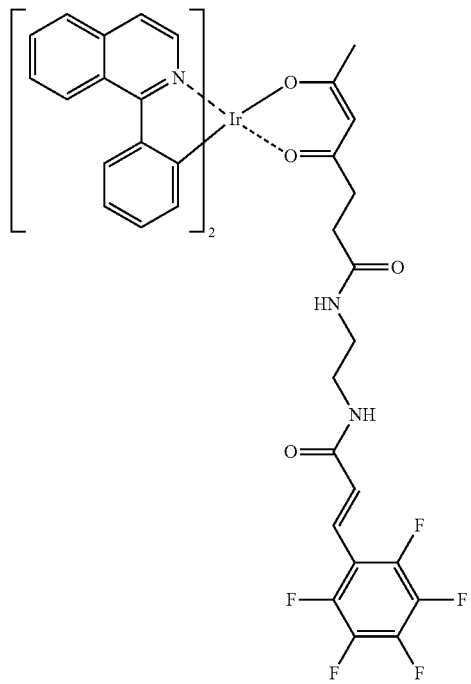

(Chem. 16)

Example 8

An organic light-emitting device was produced in the same manner as in Example 1, except that the light-emitting layer 11 was formed by printing with 10% polycarbonate added to the light-emitting layer 11 with respect to the solid content given in Example 1. As a result, a uniform light-emitting layer was obtained, and the device emitted white light composed of the three colors of red, green, and blue. The result also demonstrated that use of printing was possible.

Example 9

An organic light-emitting device was produced in the same manner as in Example 1, except that the light-emitting layer 11 was formed by printing with 10% polystyrene added to the light-emitting layer 11 with respect to the solid content given in Example 1. As a result, a uniform light-emitting layer was obtained, and the device emitted white light composed of the three colors of red, green, and blue. The result also demonstrated that use of printing was possible.

Example 10

An organic light-emitting device was produced in the same manner as in Example 1, except that the light-emitting layer 11 was formed by printing with 10% acrylic resin added to the light-emitting layer 11 with respect to the solid content given in Example 1. As a result, a uniform light-emitting layer was obtained, and the device emitted white light composed of the three colors of red, green, and blue. The result also demonstrated that use of printing was possible.

Example 11

An organic light-emitting device was produced in the same manner as in Example 1, except that the light-emitting layer 11 was formed by printing with 10% polyamide added to the light-emitting layer 11 with respect to the solid content given in Example 1. As a result, a uniform light-emitting layer was obtained, and the device emitted white light composed of the three colors of red, green, and blue. The result also demonstrated that use of printing was possible.

Example 12

The organic light-emitting device of this Example had a cross section as shown in FIG. 3.

A glass substrate was used as the substrate 100, and Al as the lower electrode 101. A mixture of $LiCO_3$ and the following chemical formula [Chem. 17] was used as the electron injection layer 9. The $LiCO_3$ content was 15 wt %. As the electron transport layer 8, a polymer material represented by the following chemical formula [Chem. 17] was used.

(Chem. 17)

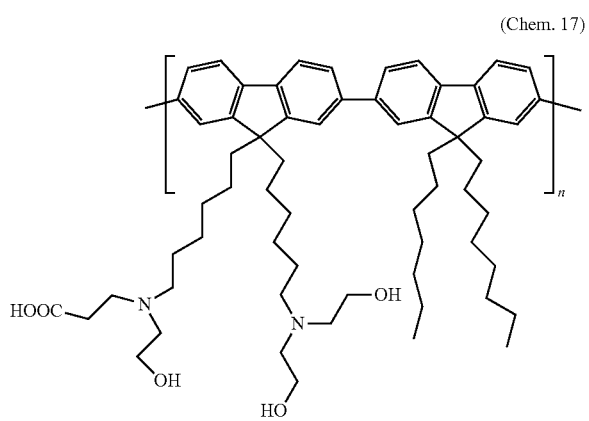

A carbazole derivative represented by the chemical formula [Chem. 2] was used as the host of the light-emitting layer 11.

An Ir complex represented by the following chemical formula [Chem. 18] was used as the red dopant 5.

(Chem. 18)

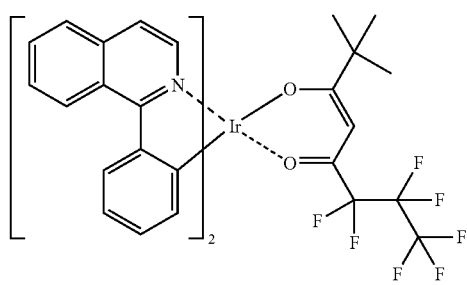

An Ir complex represented by the chemical formula [Chem. 4] was used as the blue dopant 7.

An Ir complex represented by the following chemical formula [Chem. 19] was used as the green dopant 6.

(Chem. 19)

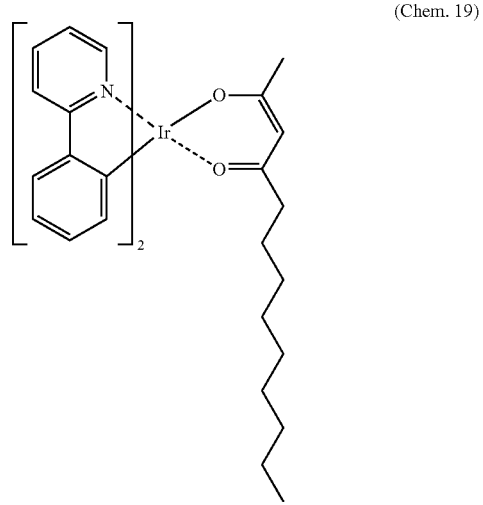

The light-emitting layer coating liquid was prepared by dissolving the host 4, the red dopant 5, the green dopant 6, and the blue dopant 7 in a suitable solvent. In this Example, the solid component molar concentrations of the host 4, the red dopant 5, the green dopant 6, and the blue dopant 7 were 0.5% for the red dopant 5, 1.0% for the green dopant 6, and 5.8% for the blue dopant 7. Toluene was used as the solvent.

An arylamine derivative represented by the following chemical formula [Chem. 20] was used as the hole transport layer 2.

(Chem. 20)

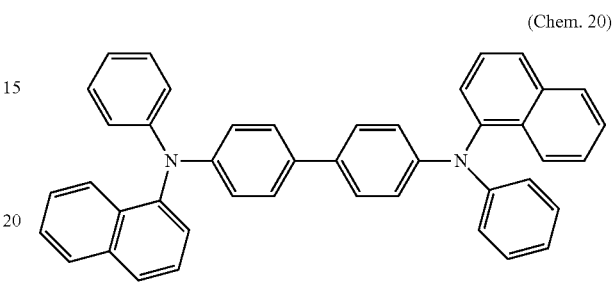

$MoO_3$ was used as the hole injection layer 1, and IZO as the upper electrode 102.

White emission composed of the three colors of red, green, and blue was obtained upon applying negative potential and positive potential to the lower electrode 101 and the upper electrode 102, respectively, of this Example.

Example 13

An organic light-emitting device was produced in the same manner as in Example 12, except for using the electron transport layer 8 of the following chemical formula [Chem. 21], and the green dopant 6 of the following chemical formula [Chem. 22]. The device emitted white light composed of the three colors of red, green, and blue.

(Chem. 21)

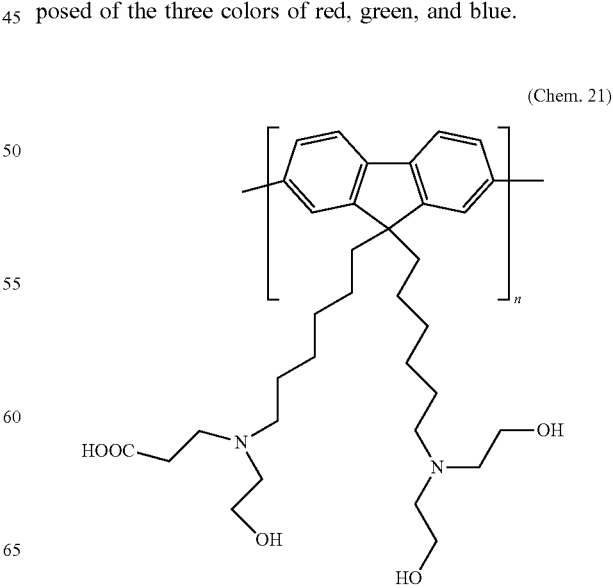

(Chem. 22)

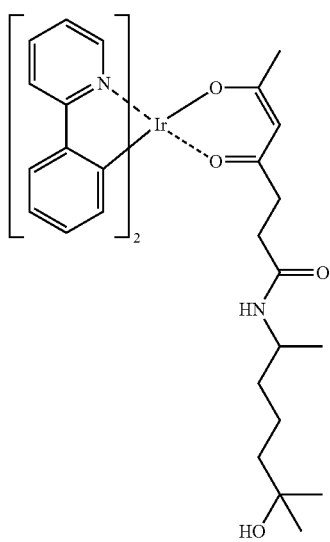

Example 14

An organic light-emitting device was produced in the same manner as in Example 12, except for using the electron transport layer 8 of the following chemical formula [Chem. 23], and the green dopant 6 of the following chemical formula [Chem. 24]. The device emitted white light composed of the three colors of red, green, and blue.

(Chem. 23)

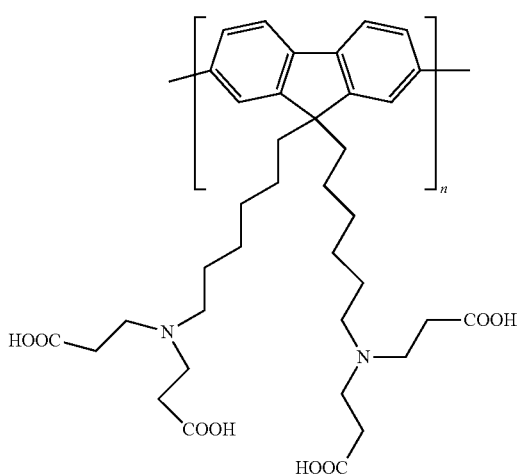

(Chem. 24)

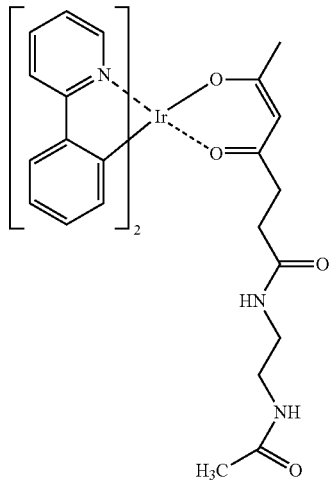

Example 15

An organic light-emitting device was produced in the same manner as in Example 12, except for using the electron transport layer 8 of the chemical formula [Chem. 23], and the green dopant 6 of the chemical formula [Chem. 22]. The device emitted white light composed of the three colors of red, green, and blue.

Example 16

An organic light-emitting device was produced in the same manner as in Example 12, except for using the electron transport layer 8 of the chemical formula [Chem. 23], and the green dopant 6 of the following chemical formula [Chem. 25]. The device emitted white light composed of the three colors of red, green, and blue.

(Chem. 25)

Example 17

An organic light-emitting device was produced in the same manner as in Example 12, except for using the electron transport layer 8 of the chemical formula [Chem. 21], and the green dopant 6 of the following chemical formula [Chem. 26]. The device emitted white light composed of the three colors of red, green, and blue.

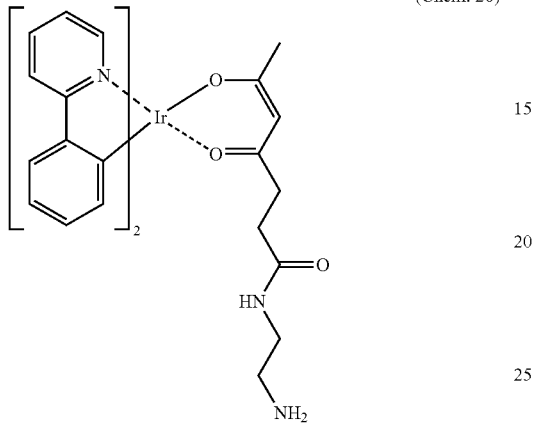
(Chem. 26)

Example 18

An organic light-emitting device was produced in the same manner as in Example 12, except for using the electron transport layer 8 of the following chemical formula [Chem. 27], and the green dopant 6 of the following chemical formula [Chem. 28]. The device emitted white light composed of the three colors of red, green, and blue.

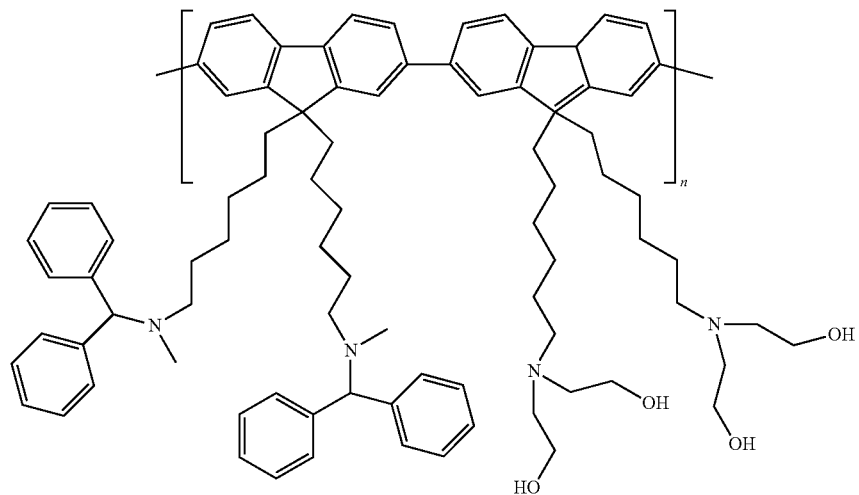
(Chem. 27)

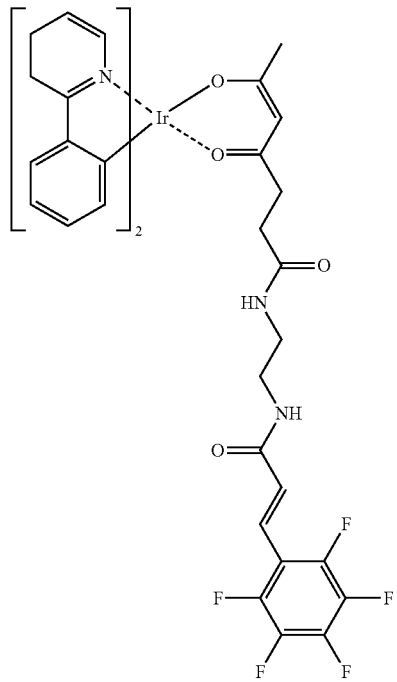

(Chem. 28)

Example 19

An organic light-emitting device was produced in the same manner as in Example 1, except that the green dopant 6 was not used for the light-emitting layer 11. The device emitted white light composed of red and blue colors.

REFERENCE SIGNS LIST

1: Hole injection layer
2: Hole transport layer
4: Host
5: Red dopant
6: Green dopant
7: Blue dopant
8: Electron transport layer
9: Electron injection layer
10: Charge transport layer
11: Light emitting layer
100: Substrate
101: Lower electrode
102: Upper electrode
103: Organic layer
104: First bank
105: Second bank
106: Resin layer
107: Sealing substrate
108: Light extracting layer
201: Diffusion plate
202: First organic light-emitting device
203: Second organic light-emitting device

The invention claimed is:

1. An organic light emitting device comprising:
a first electrode;
a second electrode;
an organic layer between the first electrode and the second electrode; and
an inorganic buffer layer in contact with the organic layer and the first electrode;
wherein the organic layer includes:
a light emitting layer that contains a host, a first dopant and second dopant, wherein the first dopant includes a first functional group, the second dopant is a red dopant and the first dopant and the second dopant have different maximum intensity wavelengths in a photoluminescence (PL) spectra of the first dopant and the second dopant; and
a charge transport layer that is in contact with the light emitting layer and disposed between the light emitting layer and the first electrode, wherein the charge transport layer contains a charge transporting material that includes a second functional group;
wherein the first functional group and the second functional group attract the first dopant toward a surface of the light emitting layer that faces the charge transport layer; and
wherein the first functional group and the second functional group are selected based on at least one of a plurality of conditions, wherein the plurality of conditions include:
(1) the first functional group and the second functional group are a hydroxy group or a carboxyl group;
(2) the first functional group is a perfluoro phenyl group and the second functional group is a phenyl group;
(3) the first functional group is a hydroxy group and the second functional group is a carboxyl group;
(4) the first functional group is a carboxyl group and the second functional group is a hydroxy group;
(5) the first functional group is an amido group and the second functional group is an acyl group;
(6) the first functional group an acyl group and the second functional group is an amido group; and
(7) the first functional group is an amino group and the second functional group is a hydroxy group.

2. The organic light emitting device according to claim 1, wherein the second dopant includes a third functional group, and the third functional group attracts the second dopant toward a surface of the light emitting layer that does not face the charge transport layer.

3. The organic light emitting device according to claim 2, wherein the light emitting layer contains a third dopant, and the first dopant, the second dopant and the third dopant have different maximum intensity wavelengths in the PL spectra of the dopants.

4. The organic light emitting device according to claim 3, wherein:
- a color of light emitted from the first dopant and a color of light emitted from the second dopant differ from each other,
- a color of light emitted from the third dopant differs from the color of light emitted from the first and the color of light emitted from the second dopant,
- the third dopant includes a fourth functional group, and
- the fourth functional group and the second functional group attract the third dopant toward the surface of the light emitting layer that faces the charge transport layer.

5. The organic light emitting device according to claim 1, wherein:
- in a film thickness direction of the light emitting layer, a peak position is located at a position where a concentration of the first dopant is at a maximum on a side shifted from a center of the light emitting layer toward the charge transport layer, and
- in the film thickness direction of the light emitting layer, the concentration of the first dopant monotonously decreases from the peak position towards a surface of the light emitting layer that does not face the charge transport layer.

6. The organic light emitting device according to claim 1, wherein the light emitting layer further contains a binder polymer, and the binder polymer is made of one or more materials selected from a polycarbonate, a polystyrene, an acrylic resin, and a polyamide.

7. The organic light emitting device according to claim 1, a bank is provided on a side surface of the light emitting layer, and a repellent layer is provided on a surface of the bank that faces the light emitting layer.

8. The organic light emitting device according to claim 1, wherein the light emitting layer is a monolayer.

9. An application liquid for forming the organic light emitting layer used in the organic light emitting device according to claim 1, wherein the application liquid for forming the organic light emitting layer includes a solvent and forms the host and the first dopant.

10. A light source apparatus comprising the organic light emitting device according to claim 1.

11. The organic light emitting device according to claim 1, wherein the inorganic layer is selected from the grouping consisting of vanadium oxide, molybdenum oxide, and tungsten oxide.

12. An organic light emitting device comprising:
- a first electrode;
- a second electrode;
- an organic layer between the first electrode and the second electrode; and
- an inorganic buffer layer in contact with the organic layer and the first electrode;
- wherein the organic layer includes:
  - a light emitting layer that contains a host, a first dopant and second dopant, wherein the first dopant includes a first functional group, the second dopant is a red dopant and the first dopant and the second dopant have different maximum intensity wavelengths in a photoluminescence (PL) spectra of the first dopant and the second dopant; and
  - a charge transport layer that is in contact with the light emitting layer and disposed between the light emitting layer and the first electrode, wherein the charge transport layer contains a charge transporting material that includes a second functional group;
- wherein the first functional group and the second functional group attract the first dopant toward a surface of the light emitting layer that faces the charge transport layer;
- the functional group of the second dopant attracts the second dopant toward a surface of the light emitting layer that does not face the charge transport layer,
- wherein the second dopant further includes a third functional group that is selected from the group containing fluoroalkyl groups, perfluoroalkyl groups, alkyl groups (of 10 or more carbon atoms), perfluoropolyether groups, and siloxy groups (—Si—O—Si—); and
- wherein the first functional group and the second functional group are selected based on at least one of a plurality of conditions, wherein the plurality of conditions include:
  (1) the first functional group and the second functional group are a hydroxy group or a carboxyl group;
  (2) the first functional group is a perfluoro phenyl group and the second functional group is a phenyl group;
  (3) the first functional group is a hydroxy group and the second functional group is a carboxyl group;
  (4) the first functional group is a carboxyl group and the second functional group is a hydroxy group;
  (5) the first functional group is an amido group and the second functional group is an acyl group;
  (6) the first functional group is an acyl group and the second functional is an amido group; and
  (7) the first functional group is an amino group and the second functional group is a hydroxy group.

13. The organic light emitting device according to claim 12, wherein the light emitting layer contains a third dopant, and the first dopant, the second dopant and the third dopant have different maximum intensity wavelengths in the PL spectra of the dopants.

14. The organic light emitting device according to claim 13, wherein:
- a color of light emitted from the first dopant and a color of light emitted from the second dopant differ from each other,
- a color of light emitted from the third dopant differs from the color of light emitted from the first and the color of light emitted from the second dopant,
- the third dopant includes a fourth functional group, and
- the second functional group attract the third dopant toward the surface of the light emitting layer that faces the charge transport layer.

15. The organic light emitting device according to claim 12, wherein:
- in a film thickness direction of the light emitting layer, a peak position is located at a position where a concentration of the first dopant is at a maximum on a side shifted from a center of the light emitting layer toward the charge transport layer, and
- in the film thickness direction of the light emitting layer, the concentration of the first dopant monotonously decreases from the peak position towards a surface of the light emitting layer that does not face the charge transport layer.

16. The organic light emitting device according to claim 12, wherein the light emitting layer contains a binder polymer, and the binder polymer is made of one or more materials selected from a polycarbonate, a polystyrene, an acrylic resin, and a polyamide.

17. The organic light emitting device according to claim 12, a bank is provided on a side surface of the light emitting layer, and a repellent layer is provided on a surface of the bank that faces the light emitting layer.

18. The organic light emitting device according to claim 12, wherein the light emitting layer is a monolayer.

19. An application liquid for forming the organic light emitting layer used in the organic light emitting device according to claim 12, wherein the application liquid for forming the organic light emitting layer includes a solvent and forms the host and the first dopant.

20. A light source apparatus comprising the organic light emitting device according to claim 12.

21. The organic light emitting device according to claim 12, wherein the inorganic layer is selected from the grouping consisting of vanadium oxide, molybdenum oxide, and tungsten oxide.

* * * * *